US012620799B2

(12) United States Patent
Brandt et al.

(10) Patent No.: US 12,620,799 B2
(45) Date of Patent: May 5, 2026

(54) CIRCUIT-BASED RESETTABLE SWITCH CONTROLLERS

(71) Applicant: The Boeing Company, Arlington, VA (US)

(72) Inventors: Randy L. Brandt, Orange, CA (US); Ronald P. Dudash, Fountain Valley, CA (US); Suhat Limvorapun, Huntington Beach, CA (US); Thomas Addicks Webb, Huntington Beach, CA (US); Margaret Duenas, Pico Rivera, CA (US); Michael Fu, Torrance, CA (US)

(73) Assignee: The Boeing Company, Arlington, VA (US)

( * ) Notice: Subject to any disclaimer, the term of this patent is extended or adjusted under 35 U.S.C. 154(b) by 138 days.

(21) Appl. No.: 18/588,980

(22) Filed: Feb. 27, 2024

(65) Prior Publication Data

US 2025/0273947 A1 Aug. 28, 2025

(51) Int. Cl.
*H02H 3/08* (2006.01)
*H03K 3/037* (2006.01)
*H03K 5/24* (2006.01)

(52) U.S. Cl.
CPC ............... *H02H 3/08* (2013.01); *H03K 3/037* (2013.01); *H03K 5/24* (2013.01)

(58) Field of Classification Search
CPC ............. H02H 3/08; H03K 3/037; H03K 5/24
USPC ........................................................ 361/93.1
See application file for complete search history.

(56) References Cited

U.S. PATENT DOCUMENTS

| | | | | | |
|---|---|---|---|---|---|
| 5,835,321 | A | * | 11/1998 | Elms | H02H 1/0015 |
| | | | | | 361/45 |
| 6,002,563 | A | * | 12/1999 | Esakoff | H02H 3/33 |
| | | | | | 361/45 |
| 6,243,034 | B1 | * | 6/2001 | Regier | H03M 1/145 |
| | | | | | 341/166 |
| 6,625,550 | B1 | * | 9/2003 | Scott | H01H 71/125 |
| | | | | | 361/87 |
| 7,330,342 | B2 | * | 2/2008 | Bald | G01R 31/3278 |
| | | | | | 361/93.6 |
| 8,045,310 | B2 | * | 10/2011 | Zanardi | H03K 17/0822 |
| | | | | | 361/93.7 |
| 8,093,826 | B1 | * | 1/2012 | Eagar | H05B 45/3725 |
| | | | | | 315/307 |
| 11,316,502 | B1 | * | 4/2022 | Cheung | H03K 3/0372 |
| 11,791,616 | B2 | * | 10/2023 | Telefus | H02H 3/105 |
| | | | | | 361/101 |
| 12,105,156 | B2 | * | 10/2024 | Matsubara | H02M 1/00 |

(Continued)

FOREIGN PATENT DOCUMENTS

EP 1462769 A2 * 9/2004 ............... G01D 3/08

*Primary Examiner* — Dharti H Patel
(74) *Attorney, Agent, or Firm* — Hanley, Flight & Zimmerman, LLC

(57) ABSTRACT

Circuit-based resettable switch controllers are disclosed. A disclosed example apparatus for use with a circuit includes an integrator to define a function that is based on a current of the circuit and time, a comparator to receive a first signal from the circuit at a first input of the comparator, and to receive a second signal from the integrator at a second input of the comparator, and a latch to receive an output of the comparator, the latch to prevent the current from flowing to or through the circuit based on the output from the comparator.

21 Claims, 8 Drawing Sheets

(56) References Cited

U.S. PATENT DOCUMENTS

| | | | | |
|---|---|---|---|---|
| 2007/0091527 A1* | 4/2007 | Julicher | ............... | H10D 89/601 |
| | | | | 361/93.1 |
| 2014/0268909 A1* | 9/2014 | Digiacomo | ....... | H02M 3/33553 |
| | | | | 363/21.04 |
| 2016/0141859 A1* | 5/2016 | Marotta | ................... | H02H 3/08 |
| | | | | 361/93.1 |
| 2022/0060011 A1* | 2/2022 | Yousef | ..................... | H03K 5/24 |
| 2023/0074777 A1* | 3/2023 | Song | ........................ | H02H 3/08 |
| 2023/0187922 A1* | 6/2023 | Randazzo | ............. | H02H 5/048 |
| | | | | 361/87 |
| 2023/0396163 A1* | 12/2023 | Wei | ....................... | H02M 3/155 |
| 2024/0128853 A1* | 4/2024 | Chen | ....................... | H02M 1/32 |

* cited by examiner

CIRCUIT-BASED RESETTABLE SWITCH CONTROLLERS

FIELD OF THE DISCLOSURE

This disclosure relates generally to circuit protection and, more particularly, to circuit-based resettable switch controllers.

BACKGROUND

To reduce design complexity many existing output switches utilize protection, such as fuses, with hard limits that are set and/or defined to be above an actual current limit. These hard limits are often set significantly above an over current limit. Some known fuses have characteristic behavior that can be approximated and/or represented by an I-squared t ($i^2t$) function.

SUMMARY

An example apparatus for use with a circuit includes an integrator to define a function that is based on a current of the circuit and time, a comparator to receive a first signal from the circuit at a first input of the comparator, and to receive a second signal from the integrator at a second input of the comparator, and a latch to receive an output of the comparator, the latch to prevent the current from flowing to or through the circuit based on the output from the comparator.

An example integrated circuit for use with a switch includes a sensing circuit to measure a current of the switch, a function circuit to define a function that is based on the current and time, a comparator circuit to receive a first signal from the circuit at a first input of the comparator circuit, and to receive a second signal from the integrator at a second input of the comparator circuit, and a latch circuit to receive an output of the comparator circuit, the latch to prevent the current from flowing through the switch based on the output from the comparator.

An example method includes measuring a current of a first signal, the current flowing through a circuit, comparing, via comparator circuitry, the first signal to a second signal from integrator circuitry, the integrator circuitry to define a function that is based on the current and time, and preventing, via latch circuitry, current from flowing through at least a portion of the circuit in response to output from the comparator.

Figures 1A, 1B:
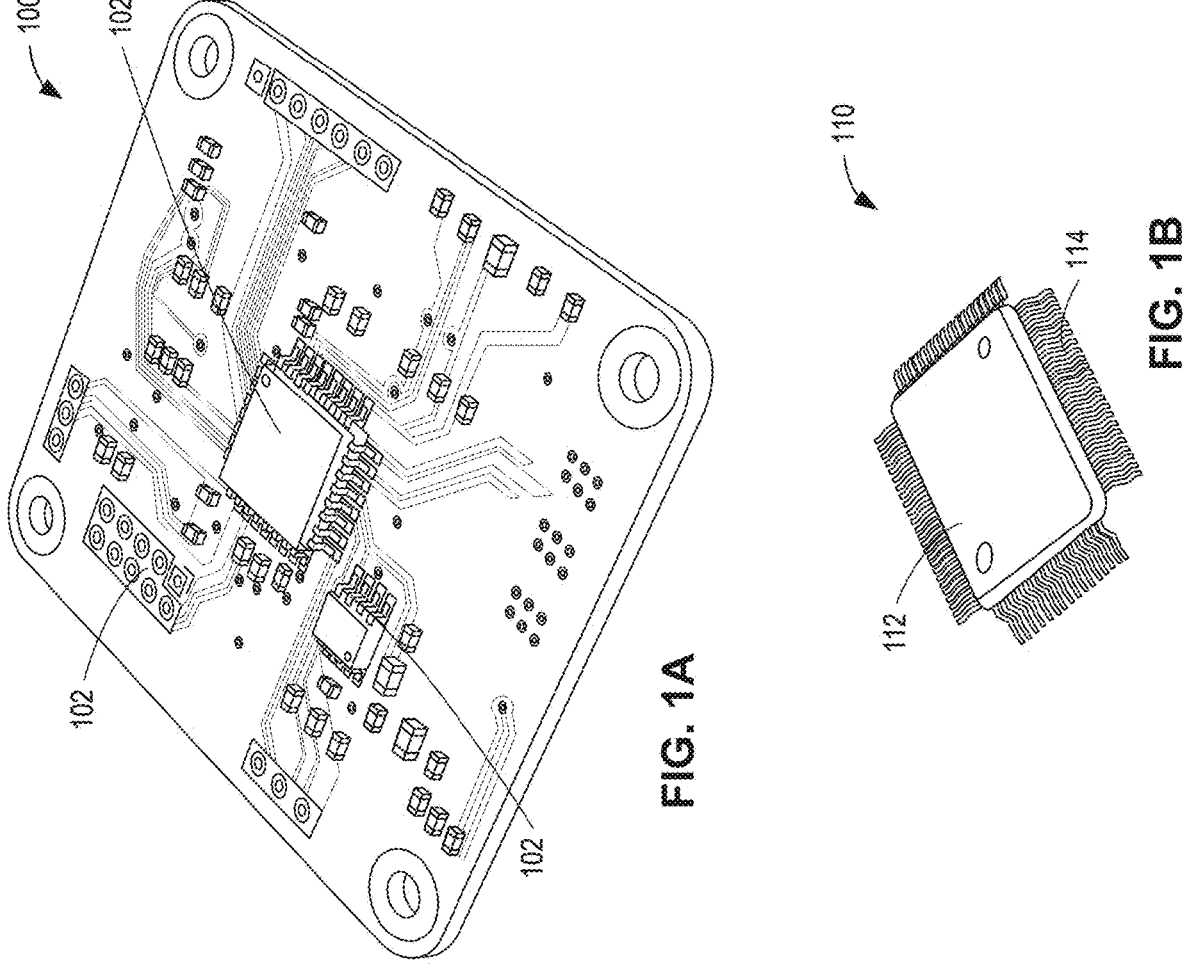
FIGS. 1A and 1B depict components and/or systems in which examples disclosed herein can be implemented.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Circuit-based resettable switch controllers are disclosed. Fuses are typically utilized to protect circuits and/or electrical components. In known implementations, fuses are generally single use such that they are rendered inoperable after an event and, thus, can necessitate repairs and/or replacement of components. Some fuses/fuse devices utilize I-squared t ($i^2t$) characteristics of a single use (e.g., one-time use) fuse device. Such a single use fuse device utilized for power interruption is generally known and accepted as an industry standard. However, enabling reset capabilities with resettable solid state $i^2t$ device characteristics can be costly, and can also significantly increase size as well as weight/mass, which can be particularly disadvantageous in applications, such as aircraft, spacecraft, etc.

In known implementations, single use fuses with $i^2t$ characteristics/functionality have been utilized in conjunction with switches. However, in some military and space applications, fuses with a relatively high current capability can be difficult to procure, costly, and can have a significant corresponding lead-time. In numerous applications where fuses are located in difficult-to-access areas, in an event of a fault, obtaining access to a single use fuse can be costly and replacement thereof can adversely affect operation, servicing and/or maintenance schedules. Multiple suppliers provide $i^2t$ Solid State Power Controller (SSPC) switch modules. However, these SSPC switch modules can have significant size and weight. Further, typical power distribution boxes can include hundreds of resettable SSPC switches, which can lead to undesirable cost, size, and weight, especially for spacecraft and aircraft applications.

Examples disclosed herein address $i^2t$ limitations by utilizing $i^2t$ functionality in conjunction with design simplifications, thereby reducing parts/components, and integrating functionality into an integrated circuit (IC) or a circuit board. Examples disclosed herein can be implemented as a circuit, circuit components, an integrated circuit, etc. Some examples disclosed herein can be at least partially implemented and/or controlled by software and/or processor implemented controls, etc.

Examples disclosed herein utilize an integrator that is used to define a function that is based on current and time, such as an $i^2t$ function, for example. Examples disclosed herein include a comparator to receive a first signal from the circuit at a first input of the comparator, and to receive a second signal from the integrator at a second input of the comparator. Further, examples disclosed herein include a latch to receive an output of the comparator. According to examples disclosed herein, the latch is to prevent (or enable) the current from flowing through the circuit based on the output from the comparator.

According to some examples disclosed herein, a reset is implemented to reset the latch subsequent to an event (e.g., the latch is to prevent current from flowing to or through at least a portion of the circuit based on an event corresponding to exceeding a threshold current, etc.). In some such examples, the reset is to prevent the latch from enabling current to flow through the circuit when a number of occurrences of latch activations exceeds a threshold number of latch activations. In some examples, the signal provided to the comparator is amplified (e.g., amplified by a current sensing amplifier). In some examples, the aforementioned function is at least partially defined by a trim resistor.

FIGS. 1A and 1B depict components and/or systems in which examples disclosed herein can be implemented. FIG. 1A depicts an example circuit board 100 having components 102 mounted thereon. Examples disclosed herein may include and/or be implemented on one or more components, traces and/or circuits defined and/or carried by the example circuit board 100.

Turning to FIG. 1B, an example integrated circuit 110 is shown. Examples disclosed herein can be at least partially implemented in the integrated circuit 110. According to some examples disclosed herein, the integrated circuit 110 includes a body 112 and traces 114. The body 112 can be coupled (e.g., soldered, mounted, etc.) to a circuit board or other circuitry. Further, in some examples, the integrated circuit 110 may be programmed and/or configured for operation.

Figures 2A, 2B:
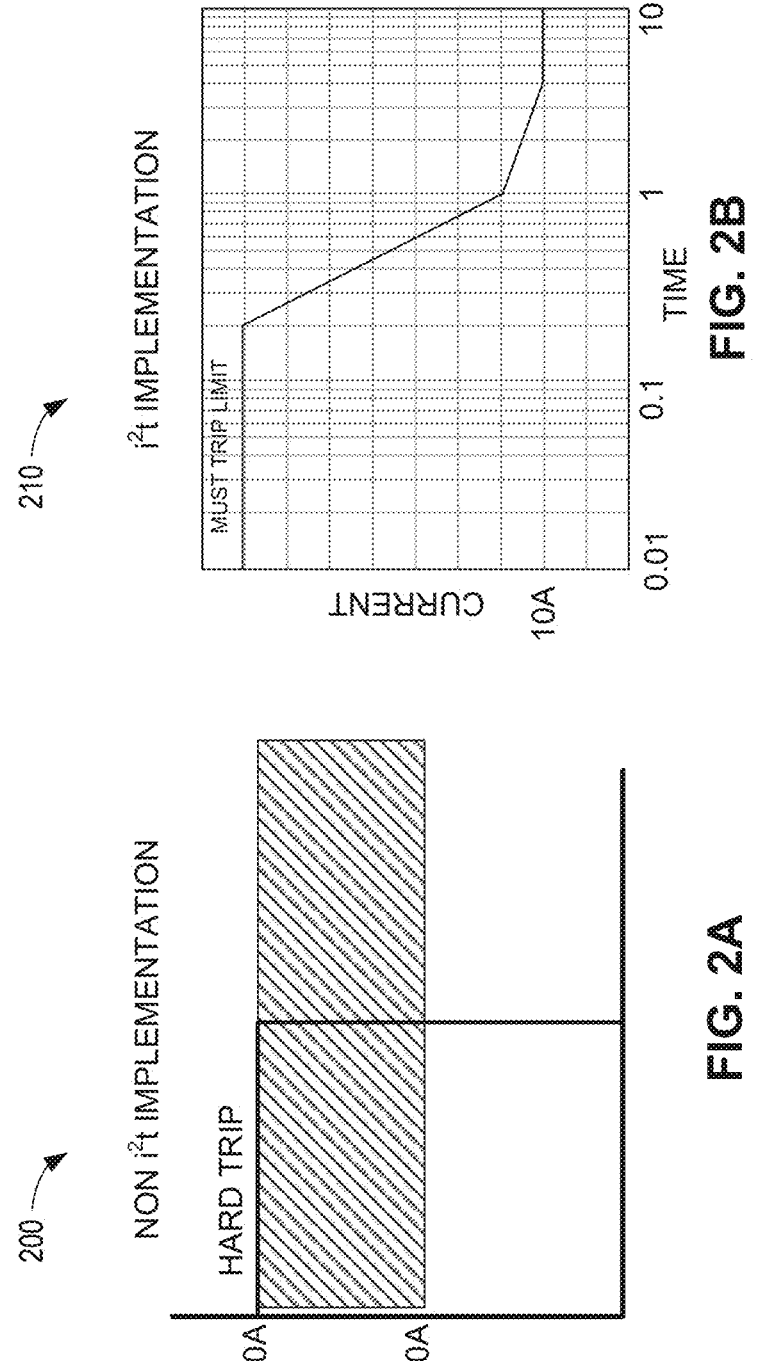
FIGS. 2A and 2B are example graphs depicting current protection characteristics.

FIGS. 2A and 2B are graphs 200, 210, respectively, depicting current protection. The example graph 200 of FIG. 2A depicts characteristics of a fuse with a hard limit. In known systems, in consideration of design complexity, existing output switches utilize hard limits that are set above a desired over current limit. For example, if an output switch is to be used with a 10 A peak load device, the switch over current trip limit can be set to 20 A to support a load electromagnetic interference (EMI) filter capacitor inrush. In other words, the 20 A trip settings exceed the 10 A load necessitated. Accordingly, at a range from 10 A to 20 A, the load device can be susceptible to excessive current (e.g., current that can cause damage). Some switches have added additional time delay circuitry, added complexity, etc.

Turning to FIG. 2B, $i^2t$ characteristic behavior is shown in the graph 210. In particular, $i^2t$ characteristics of a single use fuse device utilized for power interruption is shown and, in contrast to the graph 200 of FIG. 2A, a trip limit and/or threshold is not exhibited as a hard limit. Typically, to implement a resettable solid state with $i^2t$ device characteristics, as shown in FIG. 2B, can necessitate a relatively large size and mass of a device. In contrast, examples disclosed herein address these $i^2t$ limitations by implementing the $i^2t$ features with a simplified design and reducing and/or minimizing parts/components. Examples disclosed herein can be implemented and/or integrated onto a network (e.g., a circuit network), an IC, or a circuit board (e.g., an add-on board, a board module, etc.).

Figure 3:
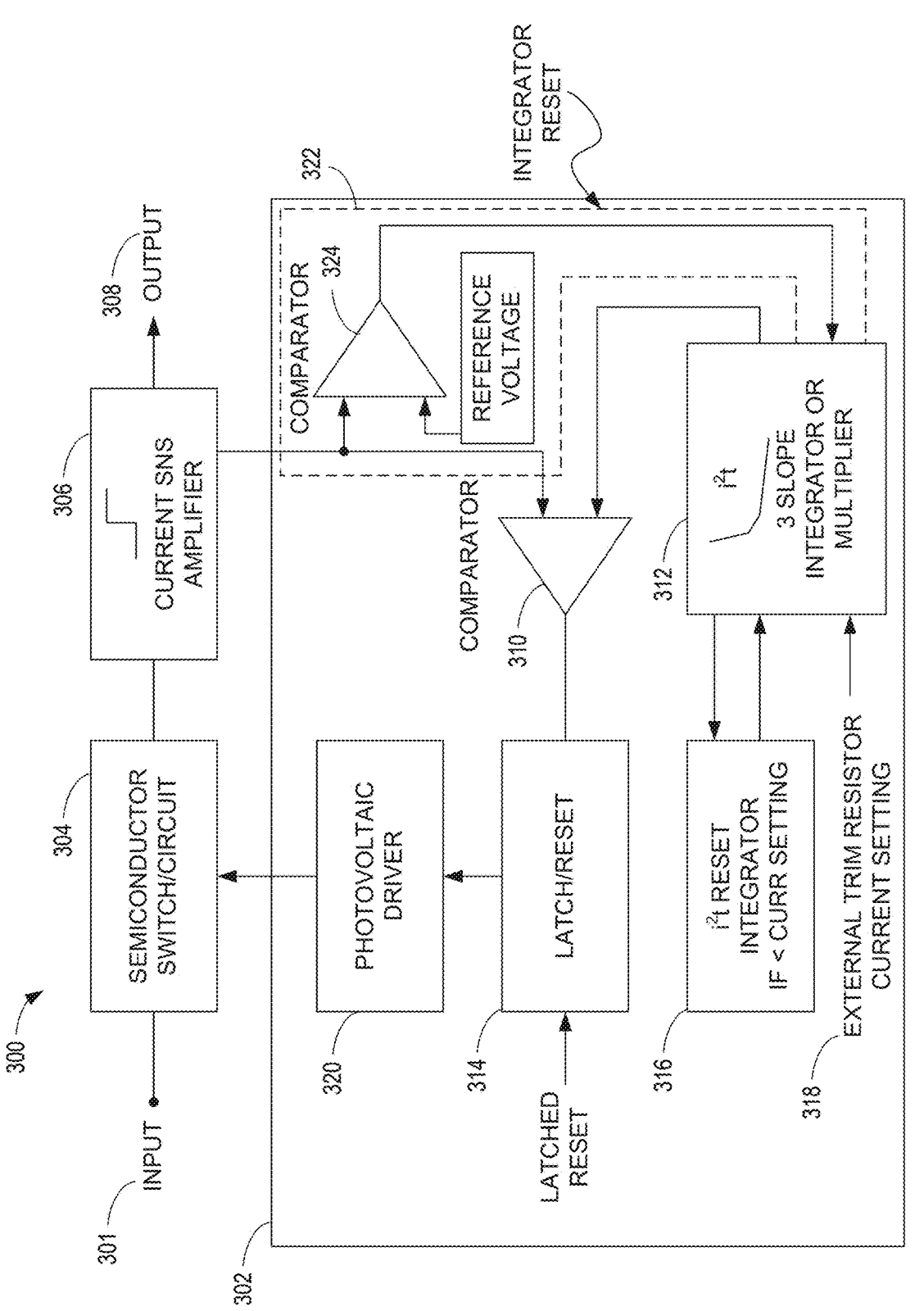
FIG. 3 is a schematic overview of an example resettable power switch controller constructed in accordance with teachings of this disclosure.

FIG. 3 is a schematic overview of an example resettable power switch controller 300 constructed in accordance with teachings of this disclosure. The resettable power switch controller 300 of the illustrated example is to receive and/or utilize an input 301, and includes a protective latch circuit 302, a switch/circuit (e.g., a semiconductor switch, a semiconductor circuit, etc.) 304, an amplifier (e.g., a current amplifier, a current sense amplifier, etc.) 306 that provides an output 308. According to examples disclosed herein, the protective circuit 302, in turn, includes a comparator (e.g., a comparator circuit, comparator circuitry, etc.) 310, an integrator (e.g., an integrator circuit, integrator circuitry, a three slope integrator, a multiplier, etc.) 312, a latch/reset (e.g., latch/reset circuitry) 314, an interface 316, inputs 318 that include a reset integrator and a current setting, and a photovoltaic driver (e.g., a light emitter driver, a light emitter, etc.) 320. According to some examples disclosed herein, the resettable power switch controller 300 includes an integrator reset (e.g., integrator reset circuitry) 322 having a corresponding comparator 324.

To cause the latch/reset 314 to control (e.g., prevent, enable, etc.) a degree of current flowing to a circuit corresponding to the semiconductor switch 304 and/or to the semiconductor switch 304, the comparator 310 provides an output thereto. In this example, the latch/reset 314 controls a degree of current passing and/or flowing through (e.g., whether current passes to or through) the switch 304. Additionally or alternatively, the latch/reset 314 controls whether current is provided to the switch 304.

To control and/or direct the latch/reset 314, the comparator 310 utilizes a first signal (e.g., a first amplified signal) from the amplifier 306 and a second signal (e.g., a second $i^2t$ characteristic signal) from the integrator 312. In particular, the example comparator 310 compares the first signal to the second signal and, in turn, the comparison is utilized to direct an input to the latch/reset 314, thereby controlling the latch/reset 314. In the illustrated example of FIG. 3, the comparison is utilized to control the latch/reset 314 by comparing measured characteristics to a function defined by the integrator 312 that is utilized to characterize $i^2t$ behavior and/or characteristics. In other words, the latch/reset 314 is controlled based on $i^2t$ behavior (e.g., an $i^2t$ function) without necessitating the typical heavy and costly equipment typically required to do so.

To define and/or characterize the $i^2t$ behavior and/or characteristics, the integrator 312 of the illustrated example utilizes the input 318 to define, calculate and/or generate a function that is based on time and current (e.g., an $i^2t$ function). However, the function can be based on any other appropriate parameter or variable. According to examples disclosed herein, the function is periodically generated, defined and/or calculated. In this example, the input 318 corresponds to a resistor that has a value, which at least partially defines a parameter and/or a shape of the function defined by the integrator 312. Notably, the $i^2t$ fuse locus curve is derived from equating heat capacity as shown below in Example Equation 1:

$$Q = cp \cdot \rho \cdot \text{Volume} \cdot \text{Temperature},\qquad(1)$$

where cp is the specific heat and $\rho$ is the density of the fuse. The energizing electrical energy can be characterized by Example Equation 2:

$$Q = i^2 \cdot R \cdot t\qquad(2)$$

Where i is the current, R is the cold resistance and t is time. Rearranging Equation 2 above results in Equation 3:

$$i = \sqrt{\frac{Q}{R \cdot t}} \qquad (3)$$

Examples disclosed herein can advantageously account for such a relationship between current and time denoted above in Equation 3.

The example multiple slope integrator 312 approximates a locus of an $i^2t$ curve that drives an amplifier which, in turn, positions the curve to match an output from a load current sense amplifier in conjunction with the comparator inputs. In this example, an output of the comparator 310 drives a latch circuit, which deactivates the power switch 304 in association with an optical coupler, for example. Both activation and deactivation signals for the power switch 304, which may be implemented using a power metal-oxide-semiconductor field-effect transistor (MOSFET) switch are driven from the high (1) and low (0) outputs of the circuit 302. The integrator 312 is deactivated (reset) with the aforementioned optical coupler such that an integrating capacitor disables integration for nominal loads. This integration is reactivated when relatively high output load currents are sensed whereby the relatively high load current is compared with the $i^2t$ locus curve.

In some examples, the interface 316 can provide an input and/or signal to the integrator 312. In some examples, the integrator 312 provides an output therefrom to the interface 316, which can operate as an inter-integrated circuit ($i^2t$) interface. In some such examples, the integrator 312 can act as a reset integrator that functions based on a current setting, for example. In a particular example, the reset integrator can function to enable operation of the switch 304 if current flowing therethrough is below a current setting/threshold. In some examples, the power switch controller 300 controls more than one of the circuit 302 (e.g., via at least one $i^2t$ interface). In some examples, an $i^2t$ interface is utilized for multiple resettable $i^2t$ feeds to be installed into relatively compact and light weight power distribution box inverters. Accordingly, resettable $i^2t$ switches in accordance with teachings of this disclosure can support a multitude of output voltage and current scenarios.

According to some examples disclosed herein, the integrator reset 322 is implemented. In some such examples, the integrator reset can include a MOSFET across an integration capacitor in association with a comparator drive, such as the comparator 324. In some such examples, the comparator 324 senses a load current status and outputs a positive voltage to the MOSFET and/or a FET if current is within a rating of a fuse and/or device acting with characteristics of a fuse. Otherwise, the comparator 324 outputs a low level signal that enables the integrator 312 to start, initiate and/or operate.

Figure 4:
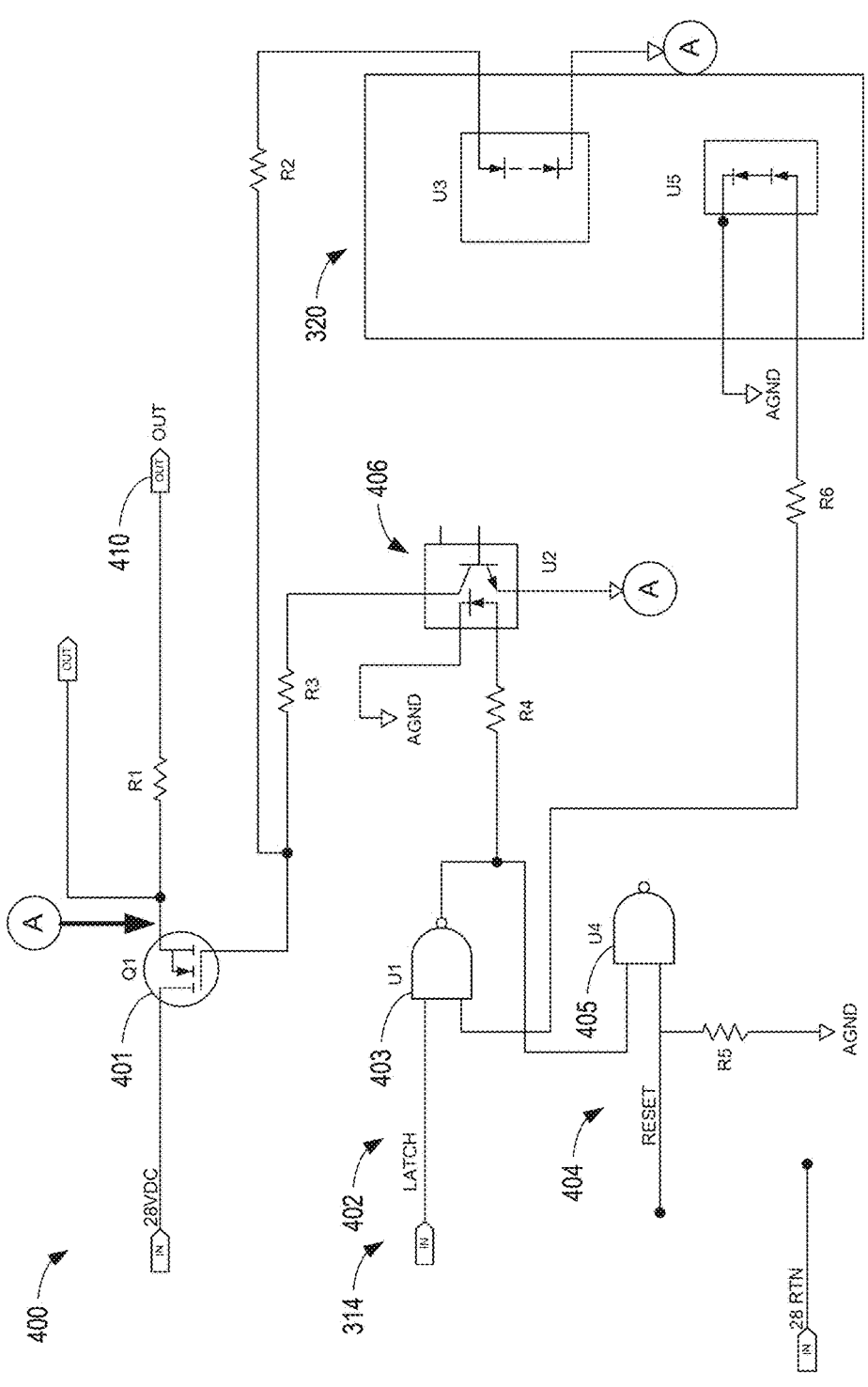
FIG. 4 is a schematic overview of an example circuit that can be implemented in examples disclosed herein.

FIG. 4 is a schematic overview of an example circuit 400 that can be implemented in examples disclosed herein. In the illustrated example of FIG. 4, the circuit 400 can implement at least a portion of the power switch controller 300 shown in FIG. 3. In this example, the circuit 400 includes a switch (e.g., a semiconductor switch) 401 that can implement the example switch 304 of FIG. 3, the latch/reset 314 that includes a latch (e.g., a latch controller, latch circuitry, a latch circuit, etc.) 402 having a NAND gate 403, and a reset (e.g., a reset controller, reset circuitry, a reset circuit, etc.) 404 having a NAND gate 405. Further, the example circuit 400 includes a coupler (e.g., an optocoupler) 406 and the example circuit 400 is provided an input 408 and, in turn, provides an output 410 therefrom. In this example, the aforementioned photovoltaic driver 320 is also shown.

In operation, the example circuit 400 is utilized to control a current that is provided to and/or passes through the switch 401. In particular, an $i^2t$ latch is shown with a MOSFET switch output. In the illustrated example of FIG. 4, the coupler 406 is implemented using an optical coupler/opto-coupler to enable or disable current moving through the switch 401.

Figure 5:
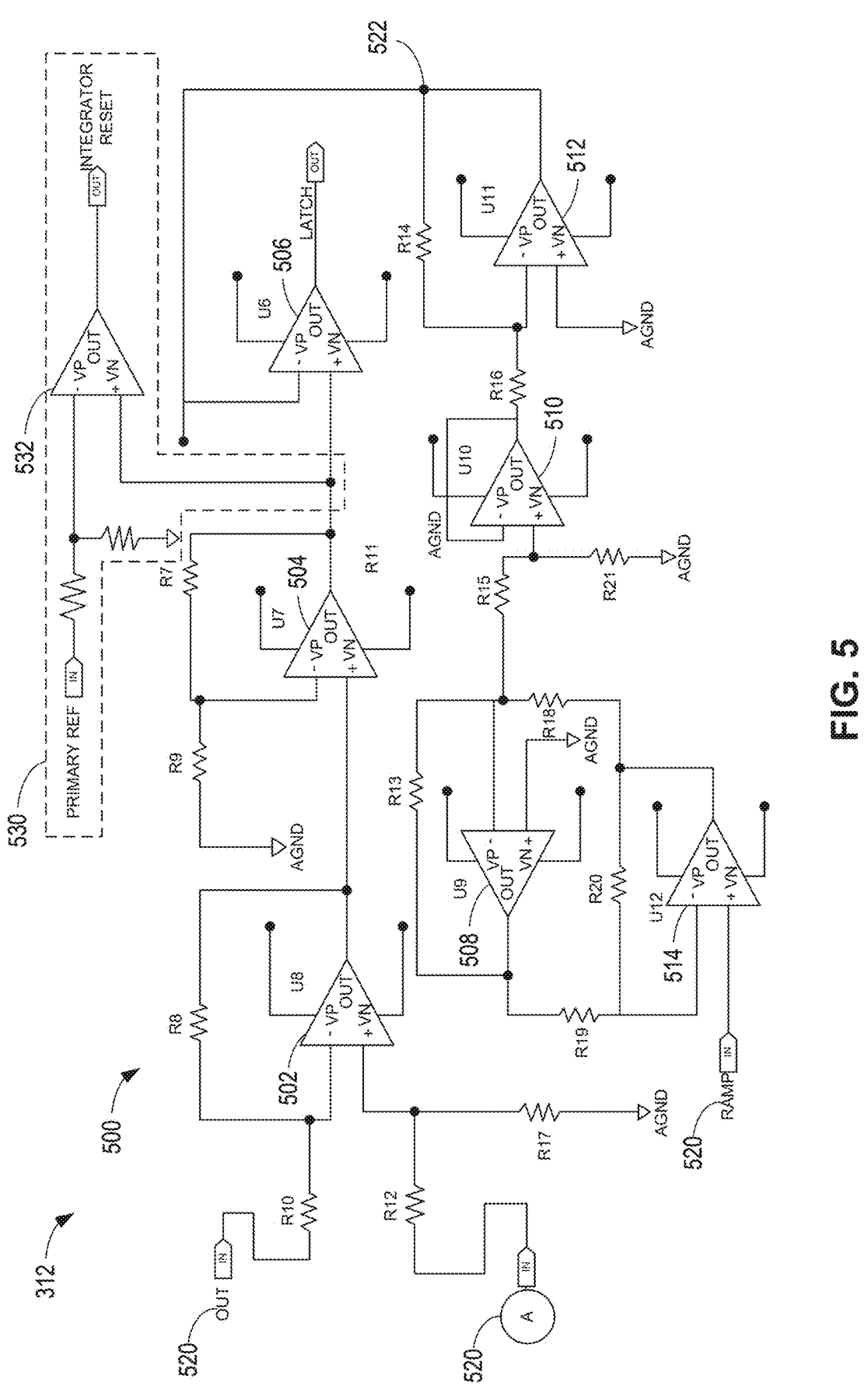
FIG. 5 is a schematic overview of another example circuit that can be implemented in examples disclosed herein.

FIG. 5 is a schematic overview of another example circuit 500 that can be implemented in examples disclosed herein. The circuit 500 of the illustrated example can be implemented in the integrator 312 and/or is implemented by the example integrator 312 to define the $i^2t$ behavior utilized shown in FIG. 3.

In the illustrated example of FIG. 5, the circuit 500 includes comparators 502, 504, 506, 508, 510, 512, 514. In operation, the comparators 502, 504, 506, 508, 510, 512, 514 are utilized for current sense and as a comparator (e.g., the comparator 310 of FIG. 3). In particular, inputs 520 provided to the comparators 502, 514 are utilized for current sensing for a comparison to a threshold (e.g., a threshold of an $i^2t$ function) and/or function (e.g., $i^2t$ function) and, in turn, the example circuit 500 provides an output 522 to the latch 402 (of FIG. 4) and/or the latch/reset 314 (of FIG. 3). In this particular example, the comparator 514 receives output from the integrator 312 and defines a relatively horizontal line/portion of an $i^2t$ function. Further, the example comparator 502 receives a signal corresponding to sensing current of the switch 304. In some examples, an integrator reset 530 is implemented with a corresponding comparator 532.

Figure 6:
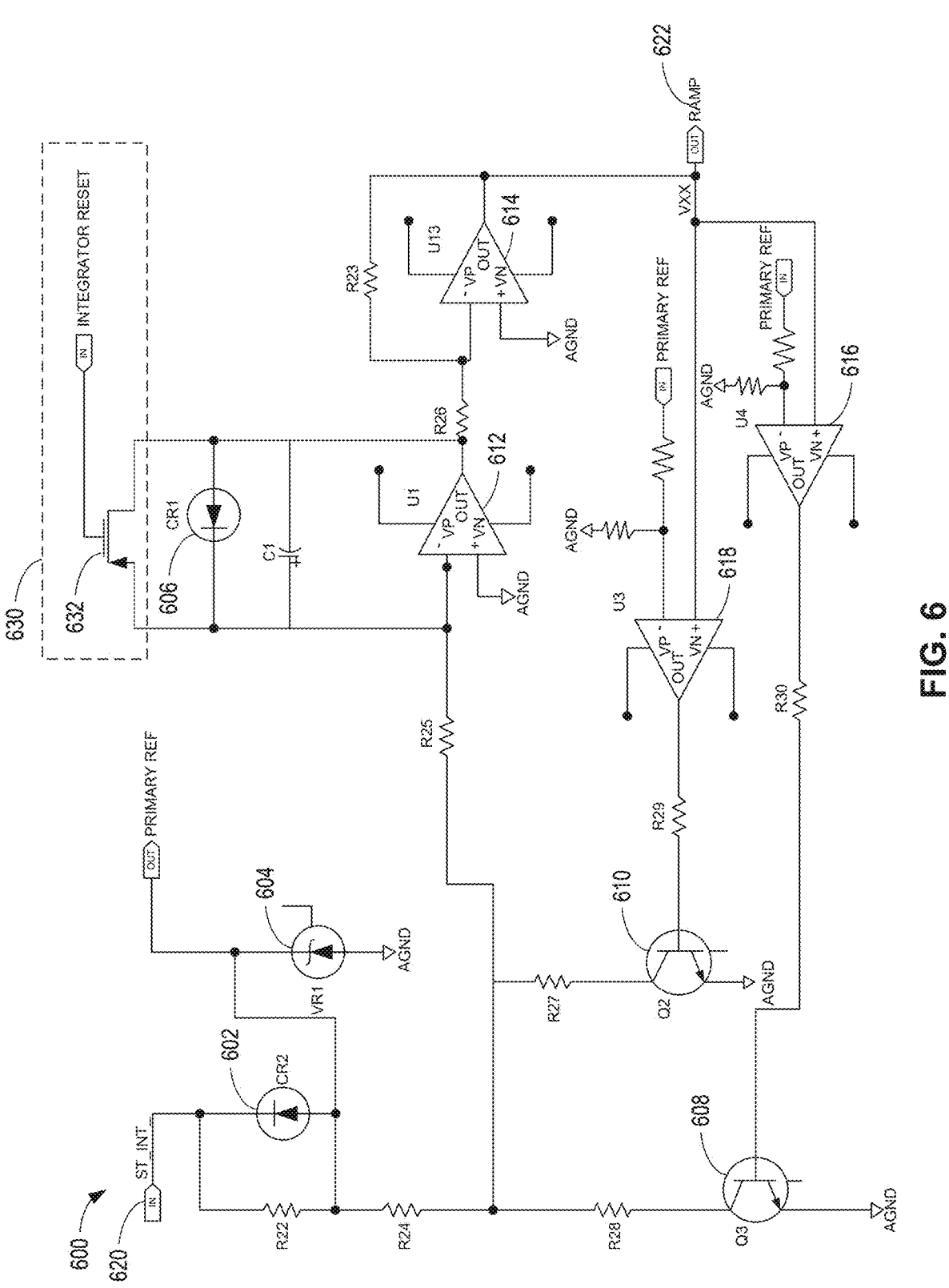
FIG. 6 is a schematic overview of yet another example circuit that can be implemented in examples disclosed herein.

FIG. 6 is a schematic overview of yet another example circuit 600 that can be implemented in examples disclosed herein. The circuit 600 of the illustrated example is implemented to approximate an $i^2t$ function, such as the function shown in FIG. 2B. In this example, the circuit 600 includes diodes 602, 604, 606, transistors 608, 610, and comparators 612, 614, 616, 618.

In the illustrated example of FIG. 6, the circuit 600 receives an input 620 and provides an output 622. The example circuit 600 is utilized to define a piece-wise linear approximation of an $i^2t$ curve (e.g., an $i^2t$ locus curve). According to examples disclosed herein, the circuit 600 can effectively characterize behavior associated with the inverse of time (or the square-root of time). In some examples, a four-quad multiplier is utilized to generate an $i^2t$ curve.

According to some examples disclosed herein, an integrator reset 630 is implemented. In some such examples, a FET 632 is implemented to be electrically coupled to the integrator reset 630.

Figure 7:
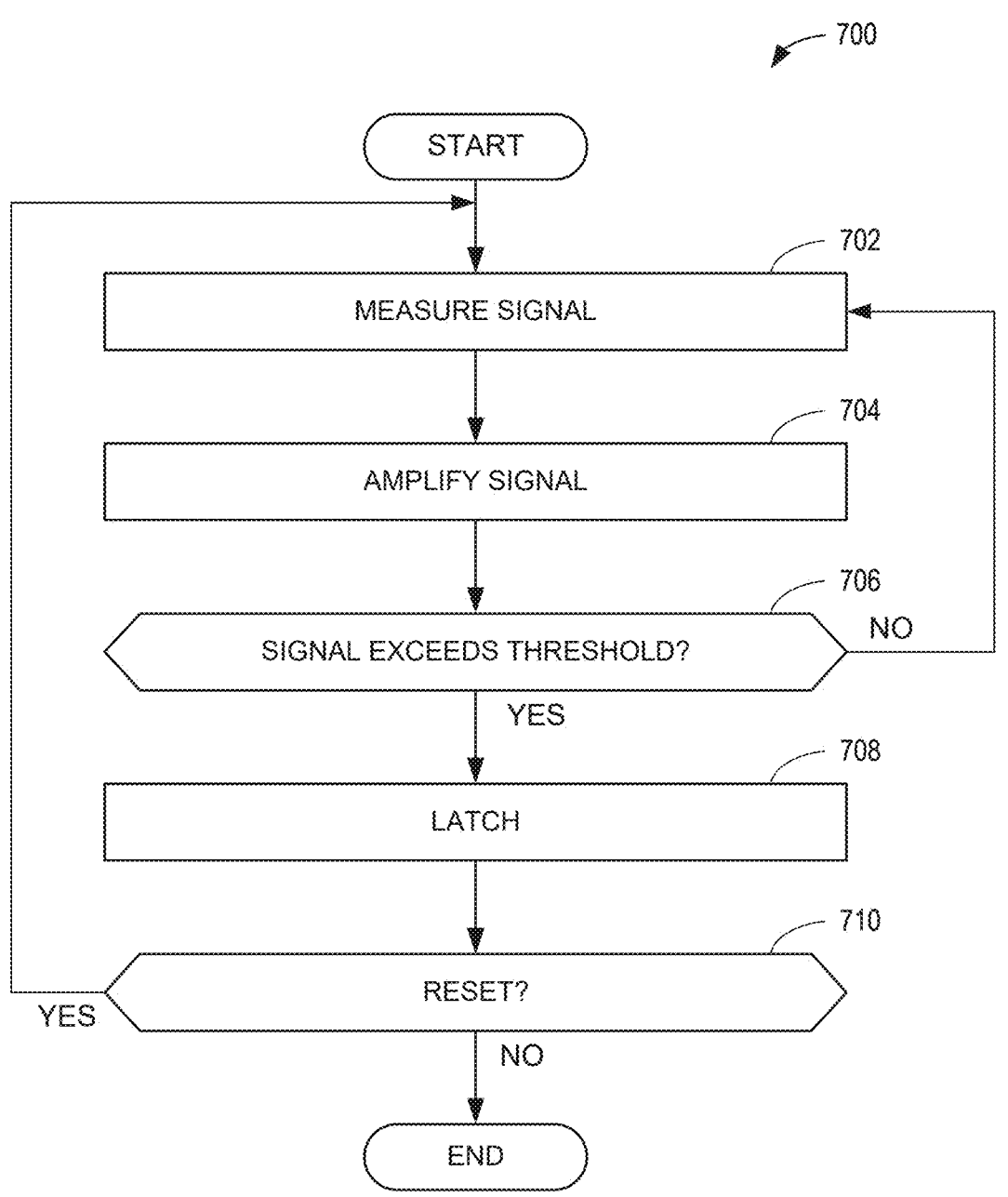
FIG. 7 is a flowchart representative of an example method, example machine readable instructions and/or example operations that may be executed, instantiated, and/or performed by example programmable circuitry to implement examples disclosed herein.

FIG. 7 is a flowchart representative of an example method 700 to implement examples disclosed herein. The example method 700 can be implemented by example machine readable instructions and/or example operations that may be executed, instantiated, and/or performed by example programmable circuitry. The example method 700 begins at block 702 at which a signal is measured corresponding to current for a circuit (e.g., the circuit/switch 304) is to be protected and/or monitored.

At block 704, in some examples, the signal is amplified. In this example, an amplifier (e.g., the amplifier 306) is utilized to amplify a current of the signal provided to the circuit. In particular, the example amplifier operates as a current sensing amplifier. Additionally or alternatively, the amplifier is utilized to amplify a signal processed by the circuit.

At block 706, it is determined whether the signal and/or a parameter/value associated with the signal exceeds a threshold (e.g., an i$^2$t function threshold), a value/measurement associated with the signal and/or a value/measurement associated with the amplified signal exceeds a threshold, which is an i$^2$t threshold in this example. If the signal exceeds the threshold (block 706) control of the process proceeds 708. Otherwise, the process returns to block 702.

At block 708, a latch (e.g., the latch 402, the latch/reset 314) is operated and/or caused to be operated, thereby preventing current from flowing through the circuit. In the illustrated example of FIG. 7, the latch is operated based on the signal and/or the parameter/value exceeding the aforementioned threshold (e.g., exceeding a point on the i$^2$t curve). In other words, the latch is operated in a similar manner to a fuse having i$^2$t characteristics and/or behavior.

At block 710, it is determined whether to reset operation of the latch. If the operation of the latch is to be reset (block 710), control of the process returns to block 702. Otherwise, the process ends. The determination may be based on whether a number of latch operations and/or events has exceeded a threshold number of latch operations and/or events. In some examples, the determination is based on whether at least one event and/or latch operation corresponds to the threshold being exceeded by a relatively significant amount. Additionally or alternatively, it is determined whether to reset an integrator and/or function circuitry that characterizes i$^2$t behavior.

Figure 8:
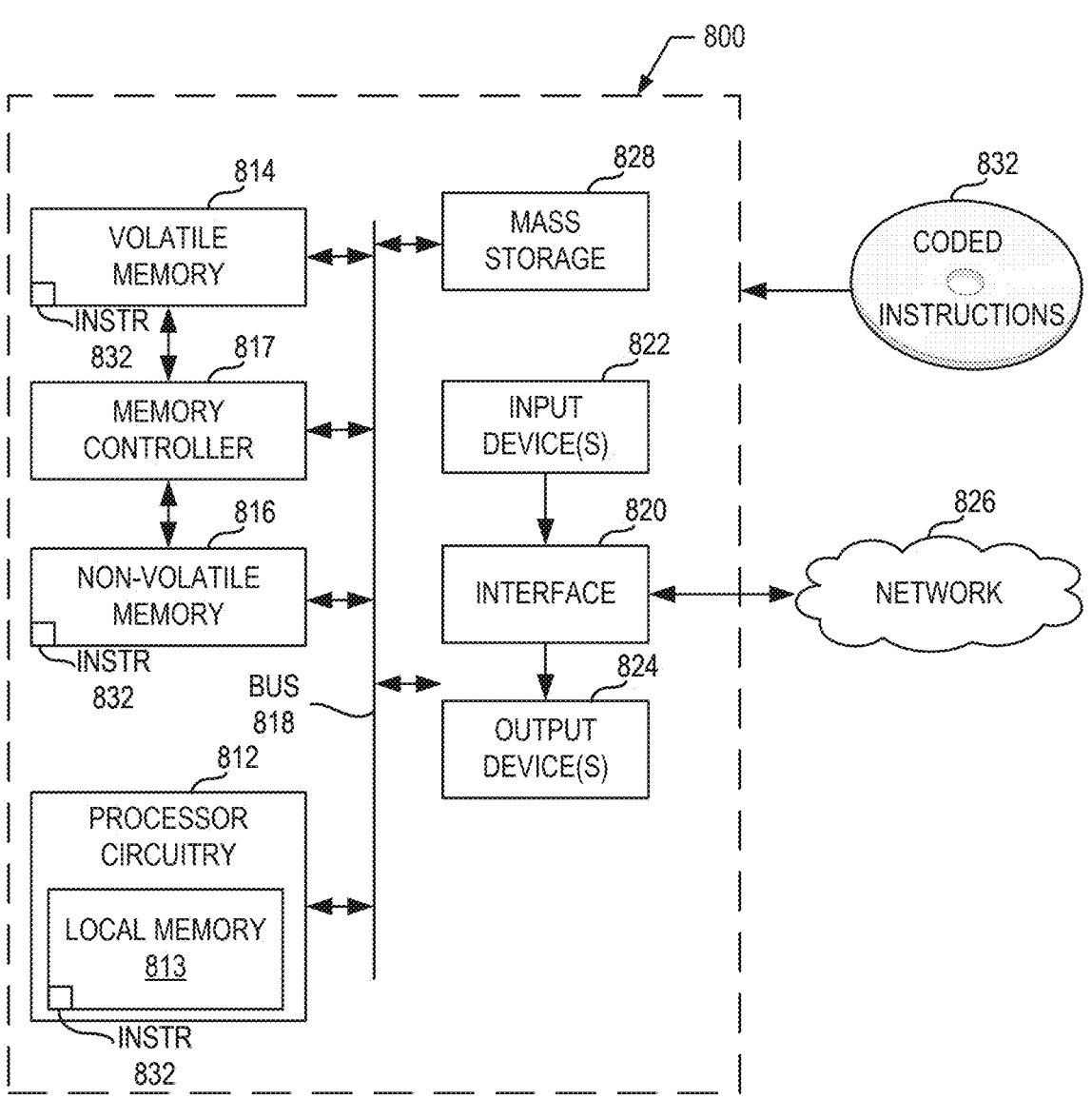
FIG. 8 is a block diagram of an example processing platform including programmable circuitry structured to execute, instantiate, and/or perform the example machine readable instructions and/or perform the example operations of FIG. 7 to implement examples disclosed herein.

FIG. 8 is a block diagram of an example programmable circuitry platform 800 structured to execute and/or instantiate the example machine-readable instructions and/or the example operations of FIG. 7 to implement and/or control examples disclosed herein. The programmable circuitry platform 800 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 800 of the illustrated example includes programmable circuitry 812. The programmable circuitry 812 of the illustrated example is hardware. For example, the programmable circuitry 812 can be implemented by one or more integrated circuits, logic circuits, FPGAs, microprocessors, CPUs, GPUs, DSPs, and/or microcontrollers from any desired family or manufacturer. The programmable circuitry 812 may be implemented by one or more semiconductor based (e.g., silicon based) devices.

The programmable circuitry 812 of the illustrated example includes a local memory 813 (e.g., a cache, registers, etc.). The programmable circuitry 812 of the illustrated example is in communication with main memory 814, 816, which includes a volatile memory 814 and a non-volatile memory 816, by a bus 818. The volatile memory 814 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 816 may be implemented by flash memory and/or any other desired type of memory device. Access to the main memory 814, 816 of the illustrated example is controlled by a memory controller 817. In some examples, the memory controller 817 may be implemented by one or more integrated circuits, logic circuits, microcontrollers from any desired family or manufacturer, or any other type of circuitry to manage the flow of data going to and from the main memory 814, 816.

The programmable circuitry platform 800 of the illustrated example also includes interface circuitry 820. The interface circuitry 820 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 822 are connected to the interface circuitry 820. The input device(s) 822 permit(s) a user (e.g., a human user, a machine user, etc.) to enter data and/or commands into the programmable circuitry 812. The input device(s) 822 can be implemented by, for example, an audio sensor, a microphone, a camera (still or video), a keyboard, a button, a mouse, a touchscreen, a trackpad, a trackball, an isopoint device, and/or a voice recognition system.

One or more output devices 824 are also connected to the interface circuitry 820 of the illustrated example. The output device(s) 824 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 820 of the illustrated example, thus, typically includes a graphics driver card, a graphics driver chip, and/or graphics processor circuitry such as a GPU.

The interface circuitry 820 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 826. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 800 of the illustrated example also includes one or more mass storage discs or devices 828 to store firmware, software, and/or data. Examples of such mass storage discs or devices 828 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine readable instructions 832, which may be implemented by the machine readable instructions of FIG. 7, may be stored in the mass storage device 828, in the volatile memory 814, in the non-volatile memory 816, and/or on at least one non-transitory computer readable storage medium such as a CD or DVD which may be removable.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities, etc., the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities, etc., the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing a semiconductor device (e.g., a transistor), a semiconductor die containing a semiconductor device, and/or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. It is to be understood that semiconductor devices are often used in orientation different than their orientation during fabrication. Thus, when referring to a semiconductor device (e.g., a transistor), a semiconductor die containing a semiconductor device, and/or an integrated circuit (IC) package containing a semiconductor die during use, the definition of "above" in the preceding paragraph (i.e., the term "above" describes the relationship of two parts relative to Earth) will likely govern based on the usage context.

As used in this patent, stating that any part is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time +1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

Example methods, apparatus, systems, and articles of manufacture to enable effective circuit-based circuit/switch protection are disclosed herein. Further examples and combinations thereof include the following:

Example 1 includes an apparatus for use with a circuit, the apparatus comprising an integrator to define a function that is based on a current of the circuit and time, a comparator to receive a first signal from the circuit at a first input of the comparator, and to receive a second signal from the integrator at a second input of the comparator, and a latch to receive an output of the comparator, the latch to prevent the current from flowing to or through the circuit based on the output from the comparator.

Example 2 includes the apparatus as defined in example 1, further including a reset to reset the latch subsequent to the latch preventing the current from flowing through the circuit.

Example 3 includes the apparatus as defined in example 2, wherein the reset is to prevent the latch from enabling current to flow through the circuit when a number of occurrences of latch activations exceeds a threshold number of latch activations.

Example 4 includes the apparatus as defined in any of examples 1 to 3, further including an amplifier to amplify the first signal for the first input of the comparator.

Example 5 includes the apparatus as defined in any of examples 1 to 4, further including at least one of a light emitter or a photovoltaic driver to receive an output from the latch.

Example 6 includes the apparatus as defined in any of examples 1 to 5, further including a trim resistor to at least partially define the function.

Example 7 includes the apparatus as defined in example 1, wherein the integrator includes a three slope integrator or multiplier.

Example 8 includes the apparatus as defined in any of examples 1 to 7, wherein the function corresponds to an I-squared t (i2t) function.

Example 9 includes an integrated circuit for use with a switch, the integrated circuit comprising a sensing circuit to measure a current of the switch, a function circuit to define a function that is based on the current and time, a comparator circuit to receive a first signal from the circuit at a first input of the comparator circuit, and to receive a second signal from the function circuit at a second input of the comparator circuit, and a latch circuit to receive an output of the comparator circuit, the latch to prevent the current from flowing through the switch based on the output from the comparator.

Example 10 includes the integrated circuit as defined in example 9, further including a reset circuit to reset the latch circuit subsequent to the latch circuit preventing the current from flowing through the switch.

Example 11 includes the integrated circuit as defined in example 10, wherein the reset circuit is to prevent the latch circuit from enabling current to flow through the switch when a number of occurrences of latch activations exceeds a threshold number of latch activations.

Example 12 includes the integrated circuit as defined in any of examples 9 to 11, further including a current sensing amplifier circuit to amplify the first signal for the first input of the comparator.

Example 13 includes the integrated circuit as defined in any of examples 9 to 12, further including at least one of a light emitter or a photovoltaic driver to receive an output signal from the latch circuit.

Example 14 includes the integrated circuit as defined in any of examples 9 to 13, wherein the function circuit is electrically coupled to a trim resistor, the trim resistor to at least partially define the function.

Example 15 includes the integrated circuit as defined in any of examples 9 to 14, wherein the function circuit defines a three slope integrator or multiplier.

Example 16 includes the integrated circuit as defined in any of examples 9 to 15, further including an integrator reset circuit to provide a first output when input current does not exceed a threshold current rating, and provide a second output when the input current exceeds the threshold current rating, the first output to enable the function circuit and the second output to disable the function circuit.

Example 17 includes a method comprising measuring a current of a first signal, the current flowing through a circuit, comparing, via comparator circuitry, the first signal to a second signal from integrator circuitry, the integrator circuitry to define a function that is based on the current and time, and preventing, via latch circuitry, current from flowing through at least a portion of the circuit in response to output from the comparator.

Example 18 includes the method as defined in example 17, further including defining, via the integrator circuitry, the function, the function to be defined based on an inverse of a square root of the time.

Example 19 includes the method as defined in any of examples 17 or 18, further including amplifying the first signal.

Example 20 includes the method as defined in any of examples 17 to 19, further including resetting, via a reset, the latch.

Example 21 includes the method as defined in example 20, wherein resetting of the latch is enabled based on a number of occurrences of latch activations being less than or equal to a threshold number of latch activations.

From the foregoing, it will be appreciated that example systems, apparatus, articles of manufacture, and methods have been disclosed that enable effective circuit-based current protection that can be relatively light and cost-effective to produce. Examples disclosed herein can accurately utilize $i^2t$ characteristics/functions/behavior to effectively control (e.g., prevent, enable) flow of current through a circuit and/or a switch. Examples disclosed herein can enable accurate and response circuit protection. Further, examples disclosed herein can enable resettable fuse functionality protection, which can extend a field life and a reliability of circuits and/or switches.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. An apparatus for use with a circuit, the apparatus comprising:
   an integrator to define a function that is based on a current of the circuit and time;
   a comparator to receive a first signal from the circuit at a first input of the comparator, and to receive a second signal from the integrator at a second input of the comparator;
   a latch to receive an output of the comparator, the latch to prevent the current from flowing to or through the circuit based on the output from the comparator; and
   a reset to reset the latch subsequent to the latch preventing the current from flowing through the circuit, the reset to prevent the latch from enabling current to flow through the circuit when a number of occurrences of latch activations exceeds a threshold number of latch activations.

2. The apparatus as defined in claim 1, further including an amplifier to amplify the first signal for the first input of the comparator.

3. The apparatus as defined in claim 1, further including at least one of a light emitter or a photovoltaic driver to receive an output from the latch.

4. The apparatus as defined in claim 1, further including a trim resistor to at least partially define the function.

5. The apparatus as defined in claim 1, wherein the comparator is a first comparator and further including a second comparator to provide input to the integrator.

6. The apparatus as defined in claim 5, wherein the second comparator is to compare the first signal to a reference voltage.

7. The apparatus as defined in claim 1, including an optocoupler coupled to an output of the latch, the optocoupler to control current provided to the circuit.

8. An apparatus for use with a circuit, the apparatus comprising:
   an integrator including a three slope integrator or multiplier;
      a comparator to receive a first signal from the circuit at a first input of the comparator, and to receive a second signal from the integrator at a second input of the comparator; and
      a latch to receive an output of the comparator, the latch to prevent the current from flowing to or through the circuit based on the output from the comparator.

9. The apparatus as defined in claim 8, wherein the integrator includes the three slope integrator.

10. The apparatus as defined in claim 9, wherein the three slope integrator is utilized to identify a locus of an I-squared t ($i^2t$) function.

11. An apparatus for use with a circuit, the apparatus comprising:
   an integrator to define a function that is based on a current of the circuit and time, wherein the function corresponds to an I-squared t ($i^2t$) function;
   a comparator to receive a first signal from the circuit at a first input of the comparator, and to receive a second signal from the integrator at a second input of the comparator; and
   a latch to receive an output of the comparator, the latch to prevent the current from flowing to or through the circuit based on the output from the comparator.

12. The apparatus as defined in claim 11, including a trim resistor to define the $i^2t$ function.

13. An integrated circuit for use with a switch, the integrated circuit comprising:
   a sensing circuit to measure a current of the switch;
   a function circuit to define a function that is based on the current and time;
   a comparator circuit to receive a first signal from the circuit at a first input of the comparator circuit, and to receive a second signal from the function circuit at a second input of the comparator circuit;
   a latch circuit to receive an output of the comparator circuit, the latch to prevent the current from flowing through the switch based on the output from the comparator and
   a reset circuit to reset the latch circuit subsequent to the latch circuit preventing the current from flowing through the switch, wherein the reset circuit is to prevent the latch circuit from enabling current to flow through the switch when a number of occurrences of latch activations exceeds a threshold number of latch activations.

14. The integrated circuit as defined in claim 13, further including a current sensing amplifier circuit to amplify the first signal for the first input of the comparator.

15. The integrated circuit as defined in claim 13, further including at least one of a light emitter or a photovoltaic driver to receive an output signal from the latch circuit.

16. The integrated circuit as defined in claim 13, wherein the function circuit is electrically coupled to a trim resistor, the trim resistor to at least partially define the function.

17. The integrated circuit as defined in claim 13, further including an integrator reset circuit to:

provide a first output when input current does not exceed a threshold current rating, and provide a second output when the input current exceeds the threshold current rating, the first output to enable the function circuit and the second output to disable the function circuit.

18. An integrated circuit for use with a switch, the integrated circuit comprising:

a sensing circuit to measure a current of the switch;

a function circuit to define a function that is based on the current and time, wherein the function circuit defines a three slope integrator or multiplier;

a comparator circuit to receive a first signal from the circuit at a first input of the comparator circuit, and to receive a second signal from the function circuit at a second input of the comparator circuit; and a latch circuit to receive an output of the comparator circuit, the latch to prevent the current from flowing through the switch based on the output from the comparator.

19. A method comprising:

measuring a current of a first signal, the current flowing through a circuit;

16 comparing, via comparator circuitry, the first signal to a second signal from integrator circuitry, the integrator circuitry to define a function that is based on the current and time;

preventing, via latch circuitry, current from flowing through at least a portion of the circuit in response to output from the comparator; and resetting, via a reset, the latch, wherein resetting of the latch is enabled based on a number of occurrences of latch activations being less than or equal to a threshold number of latch activations.

20. The method as defined in claim 19, further including amplifying the first signal.

21. A method comprising:

measuring a current of a first signal, the current flowing through a circuit;

comparing, via comparator circuitry, the first signal to a second signal from integrator circuitry;

defining, via the integrator circuitry, a function that is based on the current and time, the function to be defined based on an inverse of a square root of the time; and preventing, via latch circuitry, current from flowing through at least a portion of the circuit in response to output from the comparator.

* * * * *